US010170471B2

(12) United States Patent
Cheng et al.

(10) Patent No.: US 10,170,471 B2
(45) Date of Patent: Jan. 1, 2019

(54) BULK FIN FORMATION WITH VERTICAL FIN SIDEWALL PROFILE

(71) Applicant: International Business Machines Corporation, Armonk, NY (US)

(72) Inventors: Kangguo Cheng, Schenectady, NY (US); Hong He, Schenectady, NY (US); Sivananda K. Kanakasabapathy, Niskayuna, NY (US); Chiahsun Tseng, Wynantskill, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/292,187

(22) Filed: Oct. 13, 2016

(65) Prior Publication Data
US 2017/0033103 A1 Feb. 2, 2017

Related U.S. Application Data

(63) Continuation of application No. 14/712,072, filed on May 14, 2015, now Pat. No. 9,515,089.

(51) Int. Cl.
*H01L 27/12* (2006.01)
*H01L 27/088* (2006.01)
(Continued)

(52) U.S. Cl.
CPC .... *H01L 27/0886* (2013.01); *H01L 21/02236* (2013.01); *H01L 21/3065* (2013.01);
(Continued)

(58) Field of Classification Search
CPC ......... H01L 29/66818; H01L 21/02236; H01L 21/02238; H01L 21/845; H01L 27/1211;
(Continued)

(56) References Cited

U.S. PATENT DOCUMENTS

| 5,783,494 A | 7/1998 | Sakurai et al. |
| 5,874,362 A | 2/1999 | Wong et al. |

(Continued)

FOREIGN PATENT DOCUMENTS

EP 0565212 A3 10/1993

OTHER PUBLICATIONS

Lee, et al., "Doping effects in reactive plasma etching of heavily doped silicon", IBM Thomas J. Watson Research Center, Yorktown Heights, New York, Received Aug. 23, 1984; accepted for publication Nov. 5, 1984, Appl. Phys. Lett., vol. 46, No. 3, Feb. 1, 1985, pp. 260-262.

(Continued)

*Primary Examiner* — Jesse Y Miyoshi
*Assistant Examiner* — John Lin
(74) *Attorney, Agent, or Firm* — Edward J. Wixted, III

(57) ABSTRACT

A semiconductor device, having a heterogeneous silicon stack, wherein the heterogeneous silicon stack comprises at least a base layer, a doped silicon layer, and an undoped silicon layer. The semiconductor device further includes a plurality of silicon fins atop a doped silicon oxide fin layer and an undoped silicon oxide fin layer, wherein the plurality of silicon fins have a uniform width along the height of the plurality of silicon fins, and wherein the plurality of silicon fins have a plurality of hard mask caps.

9 Claims, 6 Drawing Sheets

(51) Int. Cl.
  *H01L 21/84* (2006.01)
  *H01L 21/762* (2006.01)
  *H01L 21/311* (2006.01)
  *H01L 29/66* (2006.01)
  *H01L 21/308* (2006.01)
  *H01L 21/3065* (2006.01)
  *H01L 21/02* (2006.01)
  *H01L 21/8234* (2006.01)
  *H01L 29/165* (2006.01)

(52) U.S. Cl.
  CPC ...... *H01L 21/3081* (2013.01); *H01L 21/3086* (2013.01); *H01L 21/31116* (2013.01); *H01L 21/31144* (2013.01); *H01L 21/76202* (2013.01); *H01L 21/823431* (2013.01); *H01L 21/845* (2013.01); *H01L 27/1211* (2013.01); *H01L 29/165* (2013.01); *H01L 29/6653* (2013.01); *H01L 29/6656* (2013.01); *H01L 21/02255* (2013.01)

(58) Field of Classification Search
  CPC ... H01L 29/16; H01L 29/161; H01L 29/7851; H01L 29/41791; H01L 29/66795; H01L 29/785; H01L 21/76202; H01L 21/76205; H01L 21/7624
  See application file for complete search history.

(56) References Cited

U.S. PATENT DOCUMENTS

| | | |
|---|---|---|
| 6,429,538 B1 | 8/2002 | Lin |
| 6,642,090 B1 | 11/2003 | Fried et al. |
| 7,422,936 B2 | 9/2008 | Barns et al. |
| 7,491,630 B2 | 2/2009 | Shroff et al. |
| 7,625,776 B2 | 12/2009 | Wells et al. |
| 2004/0222477 A1 | 11/2004 | Aller et al. |
| 2005/0153490 A1 | 7/2005 | Yoon et al. |
| 2007/0158756 A1 | 7/2007 | Dreeskornfeld et al. |
| 2011/0193172 A1 | 8/2011 | Juengling |
| 2012/0091528 A1* | 4/2012 | Chang ............... H01L 29/7848 257/347 |
| 2013/0065326 A1 | 3/2013 | Sudo |
| 2013/0078778 A1 | 3/2013 | Chien et al. |
| 2014/0057442 A1 | 2/2014 | Lee et al. |
| 2014/0312432 A1 | 10/2014 | Ching et al. |
| 2015/0200252 A1* | 7/2015 | Ching ............... H01L 29/0649 257/510 |
| 2015/0303198 A1* | 10/2015 | Ching ............... H01L 29/16 257/192 |

OTHER PUBLICATIONS

Masahara, et al., "Ultrathin Channel Vertical DG MOSFET Fabricated by Using Ion-Bombardment-Retarded Etching", IEEE Transactions on Electron Devices, vol. 51, No. 12, Dec. 2004, © 2004 IEEE, pp. 2078-2085.

Pearton, et al., "Hydrogen Iodide-Based Dry Etching of GaAs, InP, and Related Compounds", J. Electrochem. Soc., vol. 139, No. 6, Jun. 1992 © The Electrochemical Society, Inc., pp. 1763-1772.

Appendix P: List of IBM Patents or Patent Applications Treated As Related, Dated Oct. 13, 2016, pp. 1-2.

U.S. Appl. No. 14/712,072, filed May 14, 2015; Entitled "Bulk fin Formation With Vertical fin Sidewall Profile".

* cited by examiner

BULK FIN FORMATION WITH VERTICAL FIN SIDEWALL PROFILE

BACKGROUND OF THE INVENTION

The present invention relates generally to the field of the fabrication of semiconductor devices, and more particularly to the fabrication of bulk fins with vertical sidewall profiles.

Field-effect transistors (FETs) can be semiconductor devices fabricated on a bulk semiconductor substrate or on a silicon on insulator (SOI) substrate. FET devices generally consist of a source, a drain, a gate, and a channel between the source and drain. The gate is separated from the channel by a thin insulating layer, typically of silicon oxide, called the field or gate oxide. A voltage drop generated by the gate across the oxide layer induces a conducting channel between the source and drain, thereby controlling the current flow between the source and the drain. Integrated circuit designs use complementary metal-oxide-semiconductor (CMOS) technology that use complementary and symmetrical pairs of p-type and n-type metal-oxide-semiconductor field-effect transistors (MOSFETs) for logic functions.

A FinFET is a non-planar FET. The "fin" is a narrow, vertical base channel between the source and the drain. The fin is covered by a thin gate oxide and surrounded on two or three sides by an overlying gate structure.

SUMMARY

Embodiments of the present invention disclose a method for fabricating a semiconductor device, including providing a substrate, wherein the substrate is comprised of a base layer, a doped silicon layer on top of the base layer, and an undoped silicon layer on top of the doped silicon layer. The method further includes forming a hard mask layer on top of the substrate. The method further includes forming at least one mandrel on top of the hard mask layer. The method further includes forming a spacer layer on top of exposed portions of the hard mask layer and the at least one mandrel. The method further includes etching portions of the spacer layer, such that at least one surface of the at least one mandrel and at least one portion of the hard mask layer are exposed. The method further includes removing the at least one mandrel. The method further includes etching regions of the hard mask layer and the undoped silicon layer not protected by remaining portions of the spacer layer to form at least one fin, such that portions of the doped silicon layer are exposed. The method further includes removing the remaining portions of the spacer layer.

Embodiments of the present invention disclose a semiconductor device, having a heterogeneous silicon stack, wherein the heterogeneous silicon stack comprises at least a base layer, a doped silicon layer, and an undoped silicon layer. The semiconductor device further includes a plurality of silicon fins atop a doped silicon oxide fin layer and an undoped silicon oxide fin layer, wherein the plurality of silicon fins have a uniform width along the height of the plurality of silicon fins, and wherein the plurality of silicon fins have a plurality of hard mask caps.

DETAILED DESCRIPTION

Figure 1:
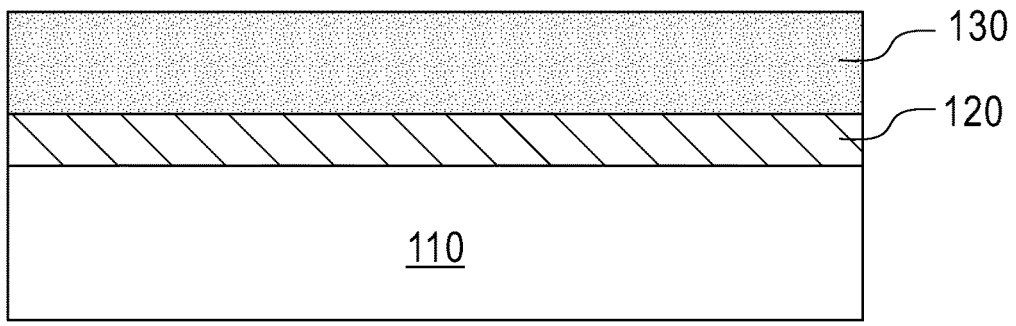
FIG. 1 depicts a cross sectional view of a semiconductor substrate upon which a fin structure may be fabricated, in accordance with an embodiment of the present invention.

Embodiments of the present invention recognize that using a heterogeneous, sandwich structure (bottom to top) of silicon substrate, doped silicon, and undoped silicon will allow the formation of bulk fins with vertical fin sidewall profiles with no degradation at the base of the fins. The fins may improve n-type and p-type field-effect transistor (FET) performance. Furthermore, embodiments of the present invention describe fabrication techniques to create a silicon fin with a vertical fin sidewall profile.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Embodiments of the present invention will now be described in detail with reference to the Figures.

FIG. 1 depicts a cross sectional view of a semiconductor substrate upon which embodiments of the invention may be fabricated, in accordance with an embodiment of the present invention. The semiconductor substrate is a heterogeneous, sandwich structure of base layer 110, doped layer 120 disposed atop base layer 110, and silicon layer 130 disposed atop doped layer 120. In one embodiment, doped layer 120 and silicon layer 130 are deposited via epitaxial growth. In other embodiments, doped layer 120 and silicon layer 130 are deposited via chemical vapor deposition (CVD).

As used herein, and unless otherwise noted, the term "depositing" can include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Base layer 110 may be composed of a silicon containing material. Silicon containing materials include, but are not limited to, silicon, single crystal silicon, polycrystalline silicon, silicon germanium, single crystal silicon germanium, polycrystalline silicon germanium, or silicon doped with carbon, silicon carbide, amorphous silicon and combinations and multi-layers thereof. Base layer 110 may also be composed of other semiconductor materials, such as germanium, and compound semiconductor substrates, such as type III-V semiconductor substrates, e.g., gallium arsenide, and type II-VI semiconductor substrates. Typically, base layer 110 has a thickness ranging from about 50 nm to about 100 nm.

In one embodiment, doped layer 120 is n-type doped silicon, such as phosphorus-doped silicon. In other embodiments, doped layer 120 is p-type doped silicon, such as boron-doped silicon. In embodiments of the present invention, silicon layer 130 is of a thickness equal to or greater than the desired height of the silicon fin. Typically, silicon layer 130 has a thickness ranging from about 35 nm to about 45 nm and doped layer 120 has a thickness ranging from about 15 nm to about 25 nm. For example, in one embodiment, silicon layer 130 (about 40 nm) is double the thickness of doped layer 120 (about 20 nm).

Figure 2:
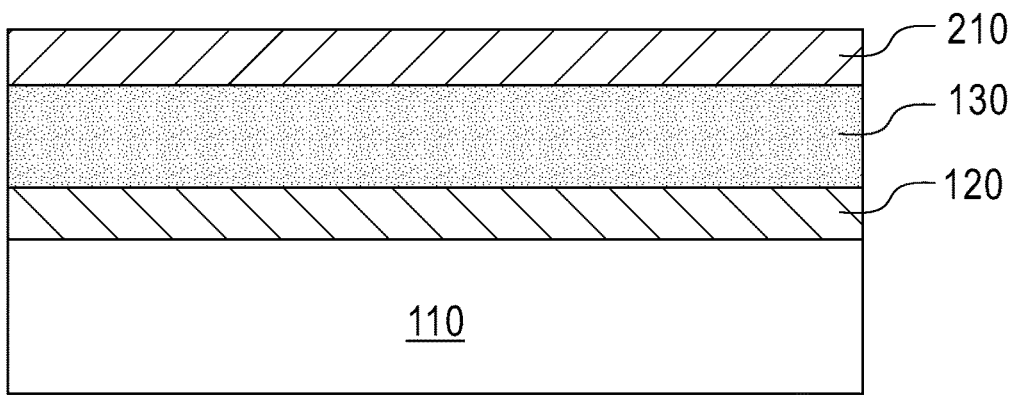
FIG. 2 depicts a cross sectional view of FIG. 1 after deposition of a hard mask atop the semiconductor substrate in FIG. 1, in accordance with an embodiment of the present invention.

FIG. 2 illustrates the structure of FIG. 1 after a deposition of hard mask layer 210 atop silicon layer 130, in accordance with an embodiment of the present invention. Hard mask layer 210 is used to define areas of silicon layer 130 which are to become fins, as described in reference to the following Figures. In some embodiments, hard mask layer 210 is a nitride deposited using, for example, low pressure chemical vapor deposition (LPCVD). Hard mask layer 210 can be any hard mask material that can act as an etch mask during the patterning of the areas of silicon layer 130 which are to become fins, as seen below in Figures that follow. Other materials with which hard mask layer 210 may be formed include, but are not limited to, silicon nitride, hafnium oxide, or titanium oxide. In general, hard mask layer 210 is of a sufficient height to prevent the removal of portions of silicon layer 130 located underneath hard mask layer 210. In some embodiments, the width of each portion of hard mask layer 210 is, eventually, equal to the width of the desired silicon fins. In other embodiments, the width of each portion of hard mask layer 210 is, eventually, of a thickness greater than the width of the desired silicon fins.

Figure 3:
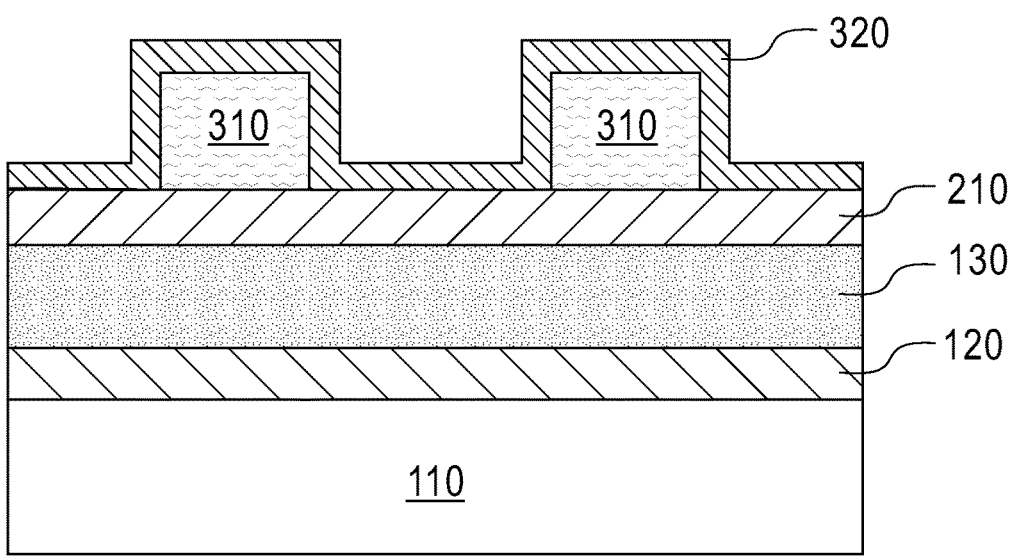
FIG. 3 depicts a cross sectional view of FIG. 2 after deposition of mandrels and a spacer atop the hard mask in FIG. 2, in accordance with an embodiment of the present invention.

FIG. 3 illustrates the structure of FIG. 2 after a deposition of mandrel 310 and spacer layer 320 atop hard mask layer 210, in accordance with an embodiment of the present invention. In one embodiment, mandrel 310 is amorphous silicon. In other embodiments, mandrel 310 is amorphous carbon. In one embodiment, mandrel 310 is deposited via epitaxial growth. In other embodiments, mandrel 310 may be grown from exposed portions of hard mask layer 210. In some embodiments, mandrel 310 may be grown using, for example, chemical vapor deposition (CVD). Still, in other embodiments, mandrel 310 is grown or deposited such that the spacing of mandrel 310 is located at a position between the fins that are to be created. In some embodiments, mandrel 310 is formed after mandrel reactive-ion etching (RIE). RIE uses chemically reactive plasma, generated by an electromagnetic field, to remove various materials. A person of ordinary skill in the art would recognize the type of plasma used will depend on the material to be removed, or that other etch processes, e.g., any etch process that etches straight down, may be used.

After mandrel 310 is formed, in one embodiment, spacer layer 320 is deposited atop hard mask layer 210 and mandrel 310 via in-situ radical assisted deposition (iRAD). In other embodiments, spacer layer 320 may be grown using, for example, CVD. In some embodiments, spacer layer 320 is silicon oxide. Still, in other embodiments, spacer layer 320 is grown or deposited such that the spacing is done to the position of the fins to be created.

Figure 4:
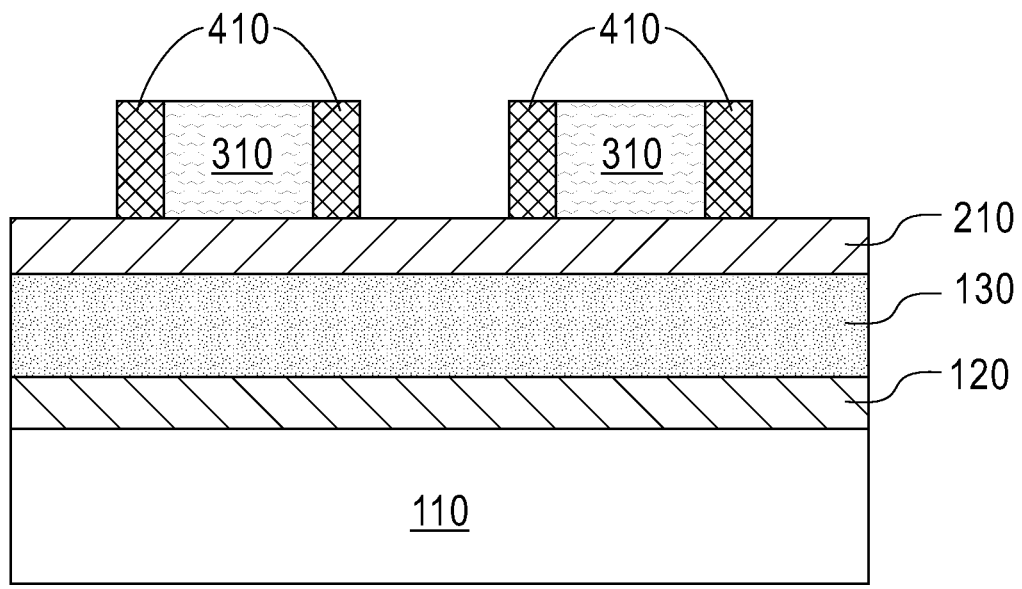
FIG. 4 depicts a cross sectional view of FIG. 3 after formation of mandrels with vertical spacer sidewalls atop the hard mask, in accordance with an embodiment of the present invention.

FIG. 4 illustrates the structure of FIG. 3 after forming exposed mandrels 310 with spacer caps 410 vertical sidewalls, in accordance with an embodiment of the present invention. In one embodiment, the process is accomplished by, uniformly, reducing the height of spacer layer 320 by a thickness that allows mandrel 310 and portions of hard mask layer 210 to be exposed. The portions of spacer layer 320 are removed using, for example, reactive-ion etching (RIE). RIE uses chemically reactive plasma, generated by an electromagnetic field, to remove various materials. A person of ordinary skill in the art would recognize the type of plasma used will depend on the material to be removed, or that other etch processes, e.g., any etch process that etches straight down, may be used. As a result of, uniformly, reducing the height of spacer layer 320, exposed mandrel 310 with spacer cap 410 vertical sidewalls remain atop hard mask layer 210.

Figure 5:
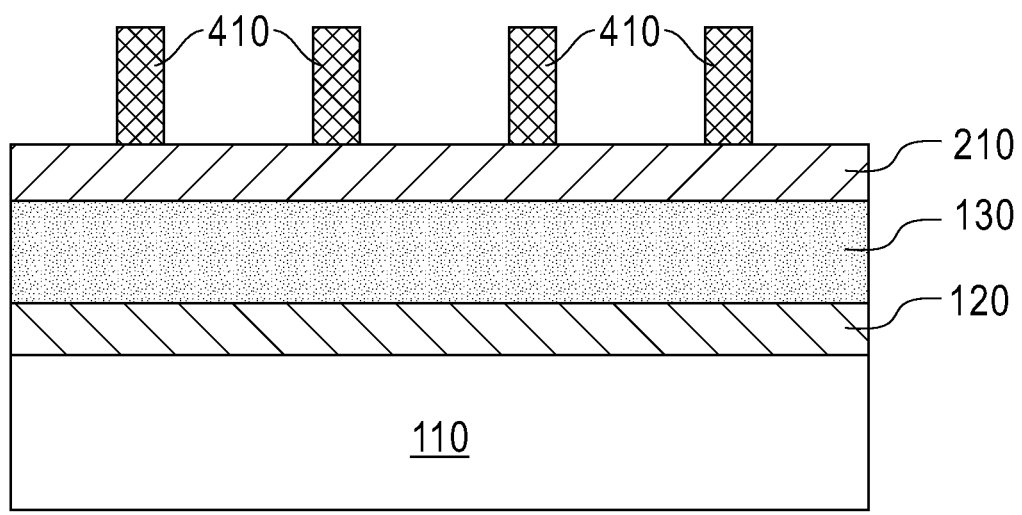
FIG. 5 depicts a cross sectional view of FIG. 4 after formation of spacer caps standing alone atop the hard mask, in accordance with an embodiment of the present invention.

FIG. 5 illustrates the structure of FIG. 4 after removing mandrel 310, in accordance with an embodiment of the present invention. In one embodiment, the process of forming spacer caps 410 standing alone without mandrel 310 is accomplished by removing portions of mandrel 310 that are exposed. In some embodiments, mandrel 310 is removed entirely. In embodiments of the present invention, upon removing the portions of mandrel 310, a plurality of spacer caps 410 remain atop hard mask layer 210. The portions of mandrel 310 are removed using, for example, RIE. As previous described, RIE uses chemically reactive plasma, generated by an electromagnetic field, to remove various materials. A person of ordinary skill in the art would recognize the type of plasma used will depend on the materials to be removed, or that other etch processes, e.g., any etch process that etches straight down, may be used. As a result of the removal of the portions of mandrel 310, a plurality of stand-alone spacer caps 410 remain atop hard mask layer 210.

Figure 6:
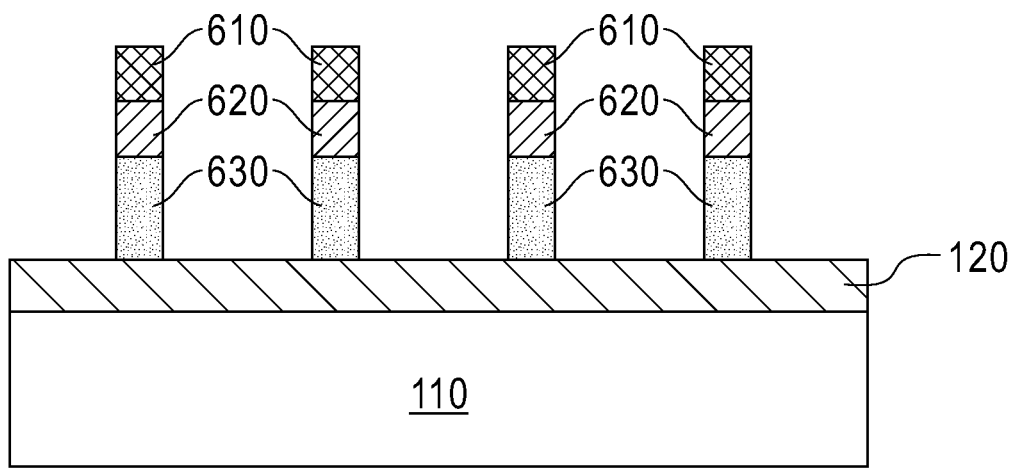
FIG. 6 depicts a cross sectional view of FIG. 5 after formation of silicon/nitride/oxide fins atop a doped silicon layer, in accordance with an embodiment of the present invention.

FIG. 6 illustrates the structure of FIG. 5 after forming a plurality of silicon/nitride/oxide fins atop doped layer 120 by removing portions of hard mask layer 210 and silicon layer 130 not protected by spacer cap 410, in accordance with an embodiment of the present invention. In one embodiment, a portion of spacer cap 410 is also removed, creating half spacer cap 610. In other embodiments, spacer cap 410 remains intact and spacer cap 410 is the top of the fin, instead of half spacer cap 610. In one embodiment, each fin includes, from bottom to top, silicon fin 630, hard mask cap 620, and half spacer cap 610. In embodiments of the present invention, upon removing the portions of hard mask layer 210 and silicon layer 130, portions of doped layer 120 are exposed.

In some embodiments, the etch rate of silicon layer 130 can be faster than the etch rate of doped layer 120. Using doped layer 120 as a stop layer and by applying an over etch step to silicon layer 130, fins with a vertical sidewall profile can be realized. The portions of hard mask layer 210 and silicon layer 130 are removed using, for example, RIE. As previously described, RIE uses chemically reactive plasma, generated by an electromagnetic field, to remove various materials. A person of ordinary skill in the art would recognize the type of plasma used will depend on the materials to be removed, or that other etch processes, e.g., any etch process that etches straight down, may be used. In some embodiments, the etching is done using plasmas containing hydrogen iodide. As a result of the removal of the portions of hard mask layer 210 and silicon layer 130, a stack, including, silicon fin 630, hard mask cap 620, and half spacer cap 610, is formed uniformly.

Figure 7:
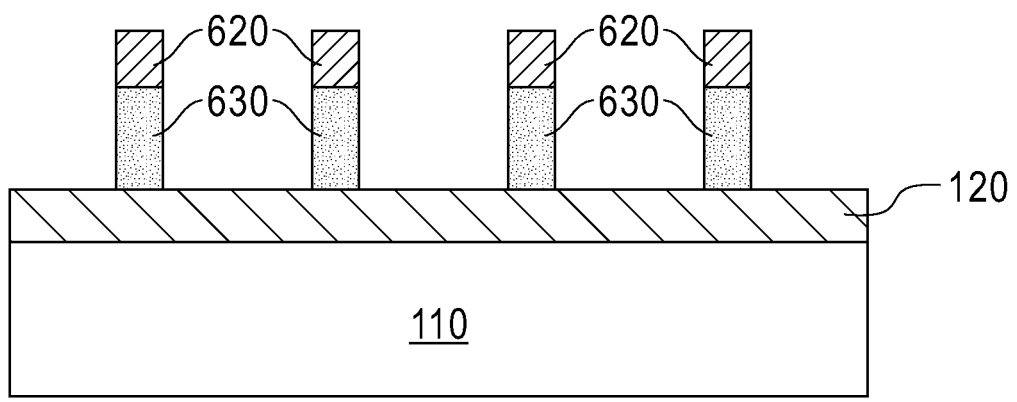
FIG. 7 depicts a cross sectional view of FIG. 6 after the removal of the spacer cap to expose a silicon fin with a hard mask cap atop the doped silicon layer, in accordance with an embodiment of the present invention.

FIG. 7 illustrates the structure of FIG. 6 after removing half spacer cap 610, in accordance with an embodiment of the present invention. In general, any stripping technique known in the art may be used to remove half spacer cap 610, in accordance with the materials that comprise half spacer cap 610. Examples of stripping techniques may include, but are not limited to, wet stripping, dry stripping, or plasma stripping. The resulting structure is one or more uniform, vertical silicon fins 630 and/or one or more uniform, vertical silicon fins 630 with hard mask caps 620 on top. With the sidewall profile of the fins being uniform and vertical, with no taper at the bottom, the fins are able to make the integrated circuit chip operate more efficiently.

Figure 8:
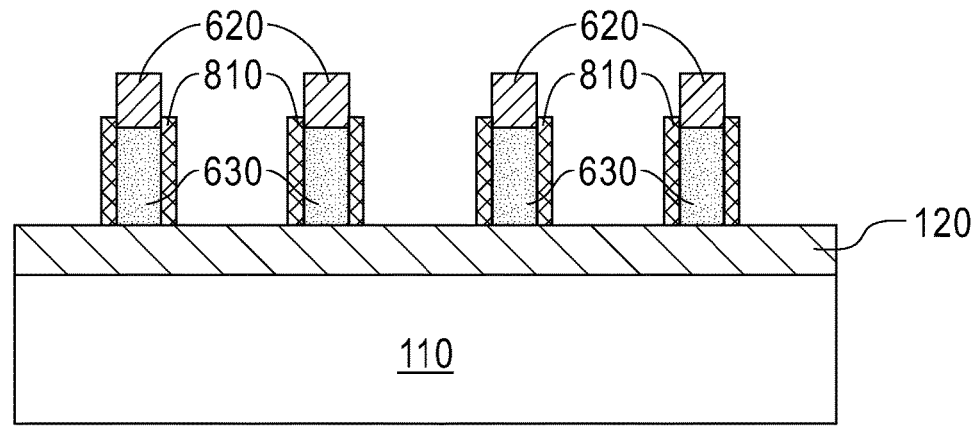
FIG. 8 depicts a cross sectional view of FIG. 7 after formation of spacers on the sidewalls of the silicon fins, in accordance with an embodiment of the present invention.

FIG. 8 illustrates the structure of FIG. 7 after formation of spacers 810 on the sidewalls of the silicon fins 630, in accordance with an embodiment of the present invention. Spacer 810 is formed by deposition and etching. Spacer 810 is used to protect the sidewalls of silicon fin 630. Additionally, spacer 810 is used to protect doped layer 120 and base layer 110 when both layers are etched (see FIG. 9). In some embodiments, spacer 810 is a nitride deposited using, for example, low pressure chemical vapor deposition (LPCVD). Spacer 810 can be any material that can act as an etch mask during the patterning of the areas around silicon fin 630, as seen below in Figures that follow. Other materials with which spacer 810 may be formed include, but are not limited to, silicon nitride, hafnium oxide, or titanium oxide. In general, spacer 810 is of a sufficient height to prevent the removal of portions of silicon fin 630 located underneath hard mask cap 620.

In some embodiments, the nitride deposited is etched to form spacer 810. The width of each portion of spacer 810 is, eventually, equal to a width that will protect silicon fins 630 from lateral etching (see FIG. 10). In one embodiment, the process of lateral etching is accomplished by, uniformly, removing portions of the deposited nitride, leaving enough nitride on the sidewalls of silicon fin 630 to allow portions of doped layer 120 to be exposed. The portions of the deposited nitride are removed using, for example, reactive-ion etching (RIE). RIE uses chemically reactive plasma, generated by an electromagnetic field, to remove various materials. A person of ordinary skill in the art would recognize the type of plasma used will depend on the material to be removed, or that other etch processes, e.g., any etch process that etches straight down, may be used. As a result of uniformly removing portions of the deposited nitride, silicon fin 630 with a hard mask cap 620 and spacer 810 vertical sidewalls remain atop doped layer 120.

Figure 9:
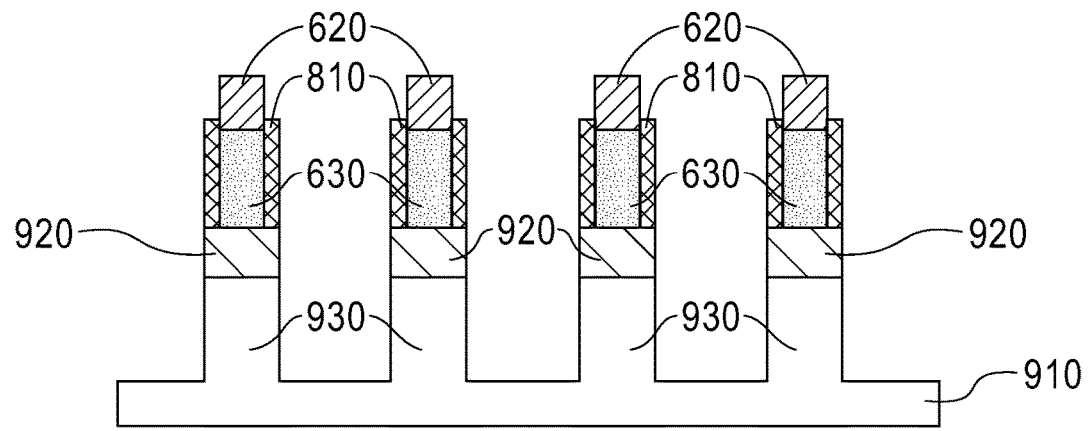
FIG. 9 depicts a cross sectional view of FIG. 8 after formation of fins atop a thin silicon layer, in accordance with an embodiment of the present invention.

FIG. 9 illustrates the structure of FIG. 8 after forming a plurality of fins atop thin base layer 910 by removing portions of doped layer 120 and base layer 110 not protected by hard mask cap 620 and spacer 810, in accordance with an embodiment of the present invention. In one embodiment, each fin includes, from bottom to top, base fin layer 930, doped fin layer 920, and silicon fin 630 with a hard mask cap 620 and spacer 810. In embodiments of the present invention, upon removing the portions of doped layer 120 and base layer 110, portions of thin base layer 910 are exposed.

The portions of doped layer 120 and base layer 110 are removed using, for example, RIE. As previous described, RIE uses chemically reactive plasma, generated by an electromagnetic field, to remove various materials. A person of ordinary skill in the art would recognize the type of plasma used will depend on the materials to be removed, or that other etch processes, e.g., any etch process that etches straight down, may be used. As a result of the removal of the portions of doped layer 120 and base layer 110, a stack, including, base fin layer 930, doped fin layer 920, and silicon fin 630 with a hard mask cap 620 and spacer 810 vertical sidewalls, is formed uniformly.

Figure 10:
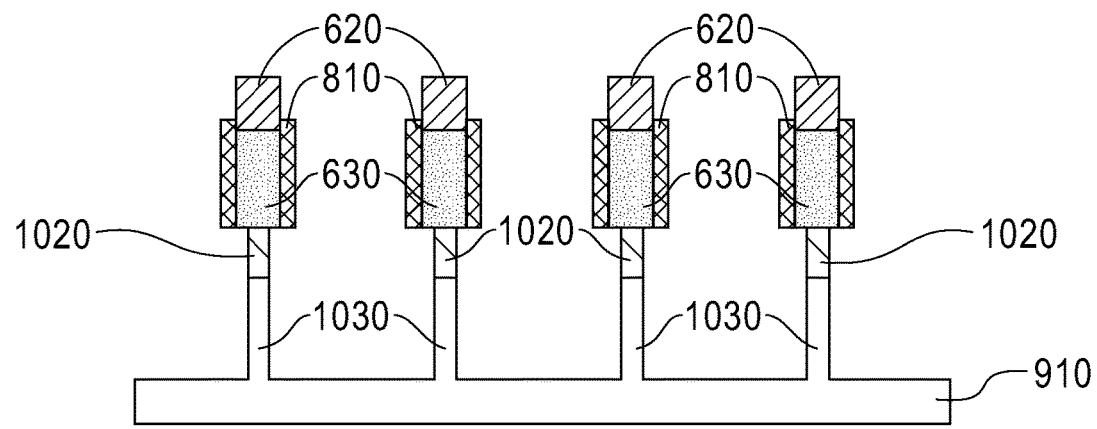
FIG. 10 depicts a cross sectional view of FIG. 9 after a lateral etch of a doped silicon fin layer and a base fin layer, in accordance with an embodiment of the present invention.

FIG. 10 illustrates the structure of FIG. 9 after forming thin doped fin layer 1020 and thin base fin layer 1030 by removing portions of doped fin layer 920 and base fin layer 930, in accordance with an embodiment of the present invention. The portions of doped fin layer 920 and base fin layer 930 are removed using, for example, RIE. RIE uses chemically reactive plasma, generated by an electromagnetic field, to remove various materials. A person of ordinary skill in the art would recognize the type of plasma used will depend on the materials to be removed, or that other etch processes, e.g., wet chemical etch, dry chemical etch, laser ablation, any lateral etch, etc., may be used. As a result of the removal of the portions of doped fin layer 920 and base fin layer 930, a stack, including, thin base fin layer 1030, thin doped fin layer 1020, and silicon fin 630 with a hard mask cap 620 and spacer 810 vertical sidewalls, is formed uniformly.

Figure 11:
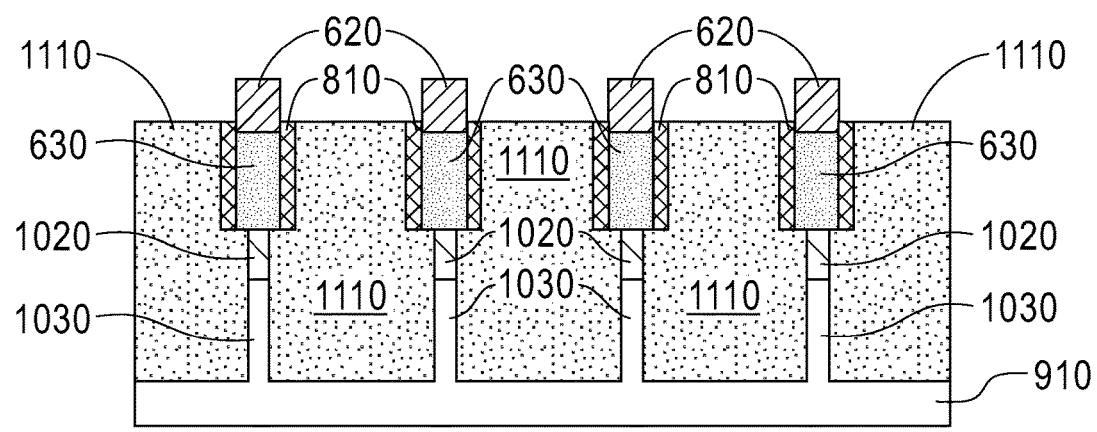
FIG. 11 depicts a cross sectional view of FIG. 10 after a shallow trench isolation fill, in accordance with an embodiment of the present invention.

FIG. 11 illustrates the structure of FIG. 10 after a fill of dielectric layer 1110 that creates shallow trench isolation (STI), in accordance with an embodiment of the present invention. STI is an integrated circuit feature that prevents electrical current leakage between adjacent semiconductor device components. STI is created early during the semiconductor device fabrication process, before transistors are formed. The key steps of the STI process involve etching a pattern of trenches in the silicon, depositing one or more dielectric materials (such as silicon dioxide) to fill the trenches, and removing the excess dielectric using a technique such as chemical-mechanical planarization.

Figure 12:
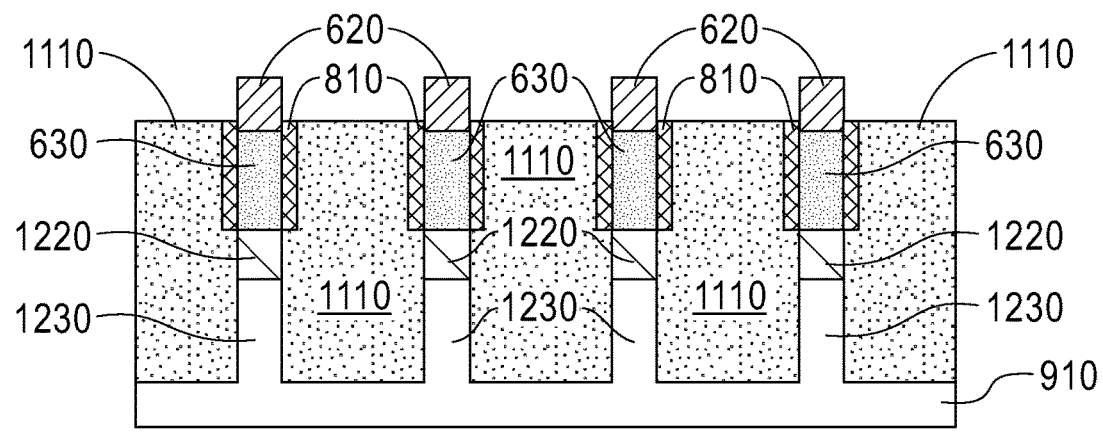
FIG. 12 depicts a cross sectional view of FIG. 11 after formation of a doped oxide and an undoped oxide, in accordance with an embodiment of the present invention.

FIG. 12 illustrates the structure of FIG. 11 after forming doped oxide fin layer 1220 and undoped oxide fin layer 1230 by performing a low-temperature oxidation, in accordance with an embodiment of the present invention. Low-temperature oxidation is a reaction, occurring at or below room temperature, between a solid and a gas, usually involving the combination of oxygen with metals. The low-temperature oxidation converts thin doped fin layer 1020 to doped oxide fin layer 1220 and converts thin base fin layer 1030 to undoped oxide fin layer 1230, creating a bilayer oxide.

Figure 13:
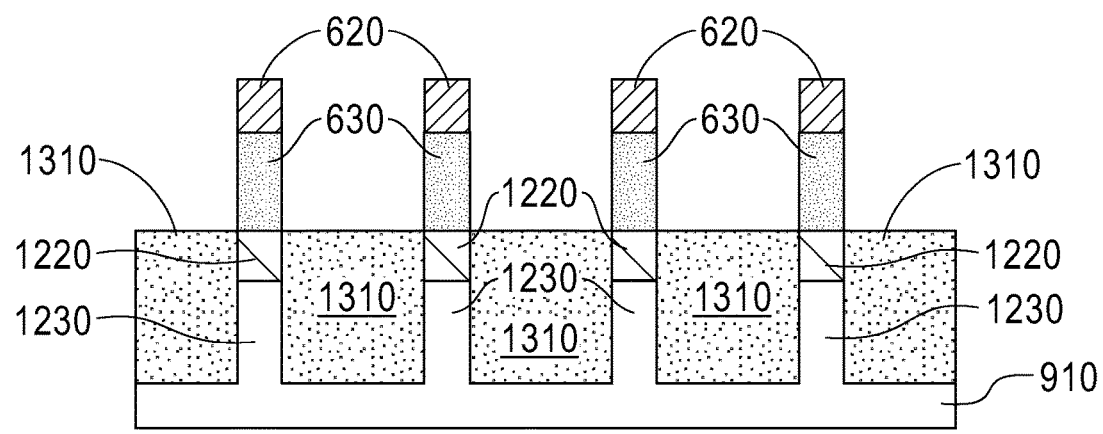
FIG. 13 depicts a cross sectional view of FIG. 12 after revealing the silicon fins with a hard mask cap atop the doped oxide, in accordance with an embodiment of the present invention.

FIG. 13 illustrates the structure of FIG. 12 after revealing the silicon fins 630 with hard mask caps 620 atop the doped oxide fin layer 1220 by etching or stripping away dielectric layer 1110 to create low dielectric layer 1310 and removing spacer 810, in accordance with an embodiment of the present invention. In one embodiment, only spacer 810 is removed. In other embodiments, spacer 810 and hard mask cap 620 are removed. The resulting structure is a fin structure with an undoped fin channel (silicon fin 630), a doped oxide layer below the undoped fin channel (doped oxide fin layer 1220), and an undoped oxide layer below the doped oxide layer (undoped oxide fin layer 1230). The fin channel is substantially vertical, allowing an integrated circuit chip to operate more efficiently.

The method as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described embodiments of a uniform, vertical silicon fin with or without a hard mask cap and a process of manufacturing a uniform, vertical silicon fin with or without a hard mask cap (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A semiconductor device, comprising:
    a base layer; and
    a plurality of fins atop the base layer, wherein:
        each fin comprises:
            an undoped silicon oxide fin layer atop the base layer;
            a doped silicon oxide fin layer atop the undoped silicon oxide fin layer;
            a silicon fin layer atop the doped silicon oxide fin layer; and
            a hard mask cap atop the silicon fin layer;
        each fin has a uniform width along a height of the respective fin along a first direction;
        the height spans from an upper surface of the base layer to an upper surface of the hard mask cap; and
        the first direction is a direction that intersects a first fin and a second fin of the plurality of fins.

2. The semiconductor device of claim 1, wherein the base layer comprises one or more of the following: silicon; germanium; silicon germanium; silicon carbide; type III-V compound semiconductors; and type II-VI compound semiconductors.

3. The semiconductor device of claim 1, wherein the base layer has a thickness greater than or equal to 50 nm and less than or equal to 100 nm.

4. The semiconductor device of claim 1, further comprising:
    a dielectric layer laterally adjacent to the doped silicon oxide fin layer and the undoped silicon oxide fin layer.

5. The semiconductor device of claim 1, wherein the undoped silicon oxide fin layer is directly atop the base layer.

6. The semiconductor device of claim 1, wherein the doped silicon oxide fin layer is directly atop the undoped silicon oxide fin layer.

7. The semiconductor device of claim 1, wherein the silicon fin layer is directly atop the doped silicon oxide fin layer.

8. The semiconductor device of claim 1, wherein the hard mask cap is directly atop the silicon fin layer.

9. The semiconductor device of claim 1, wherein the plurality of fins are directly atop the base layer.

* * * * *